(12) United States Patent
Watanabe et al.

(10) Patent No.: US 9,325,003 B2
(45) Date of Patent: Apr. 26, 2016

(54) NEGATIVE ELECTRODE ACTIVE MATERIAL FOR ELECTRIC DEVICE

(71) Applicant: NISSAN MOTOR CO., LTD., Kanagawa (JP)

(72) Inventors: Manabu Watanabe, Yokosuka (JP); Osamu Tanaka, Yokosuka (JP); Masao Yoshida, Zushi (JP)

(73) Assignee: NISSAN MOTOR CO., LTD., Yokohama-Shi, Kanagawa (JP)

( * ) Notice: Subject to any disclaimer, the term of this patent is extended or adjusted under 35 U.S.C. 154(b) by 114 days.

(21) Appl. No.: 14/368,167

(22) PCT Filed: Nov. 5, 2012

(86) PCT No.: PCT/JP2012/078602
§ 371 (c)(1),
(2) Date: Jun. 23, 2014

(87) PCT Pub. No.: WO2013/099441
PCT Pub. Date: Jul. 4, 2013

(65) Prior Publication Data
US 2014/0353546 A1    Dec. 4, 2014

(30) Foreign Application Priority Data
Dec. 27, 2011    (JP) .................. 2011-284655

(51) Int. Cl.
| | | |
|---|---|---|
| H01M 4/38 | (2006.01) |
| H01M 4/134 | (2010.01) |
| C22C 13/00 | (2006.01) |
| C22C 30/04 | (2006.01) |
| C23C 14/35 | (2006.01) |
| C23C 14/16 | (2006.01) |
| H01M 4/133 | (2010.01) |
| H01M 4/04 | (2006.01) |

(52) U.S. Cl.
CPC ............... *H01M 4/386* (2013.01); *C22C 13/00* (2013.01); *C22C 30/04* (2013.01); *C23C 14/165* (2013.01); *C23C 14/35* (2013.01); *H01M 4/133* (2013.01); *H01M 4/134* (2013.01); *H01M 4/38* (2013.01); *H01M 4/387* (2013.01); *H01M 4/0426* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2006/0040182 A1 | 2/2006 | Kawakami et al. | |
| 2007/0200101 A1* | 8/2007 | Asao et al. .................... | 252/500 |
| 2009/0061322 A1 | 3/2009 | Kawakami et al. | |
| 2010/0119942 A1* | 5/2010 | Kumar ........................ | 429/220 |
| 2010/0288077 A1* | 11/2010 | Le ................................. | 75/392 |

FOREIGN PATENT DOCUMENTS

| | | |
|---|---|---|
| CN | 101179126 A | 5/2008 |
| JP | 2004311429 A | 11/2004 |
| JP | 2007026805 A | 2/2007 |
| JP | 2007026926 A | 2/2007 |

* cited by examiner

*Primary Examiner* — Tanisha Diggs
(74) *Attorney, Agent, or Firm* — Young Basile Hanlon & MacFarlane P.C.

(57) ABSTRACT

A negative electrode active material for an electric device includes an alloy containing, in terms of mass ratio, 35%≤Si≤78%, 7%≤Sn≤30%, 0%<Ti≤37% and/or 35%≤Si≤52%, 30%≤Sn≤51%, 0%<Ti≤35%, and inevitable impurities as a residue. The negative electrode active material can be obtained with a multi DC magnetron sputtering apparatus by use of, for example, silicon, tin and titanium as targets. An electric device employing the negative electrode active material can keep a high discharge capacity and ensure a high cycle property.

8 Claims, 7 Drawing Sheets

NEGATIVE ELECTRODE ACTIVE MATERIAL FOR ELECTRIC DEVICE

CROSS REFERENCE TO RELATED APPLICATION

The present application claims priority to Japanese Patent Application No. 2011-284655, filed Dec. 27, 2011 and incorporated herein in its entirety.

TECHNICAL FIELD

The present invention relates to a negative electrode active material for an electric device such as a secondary battery or a capacitor, suitably used as a power source for driving a motor for use in a vehicle such as an electric vehicle (EV) and a hybrid electric vehicle (HEV). The present invention also relates to a negative electrode, an electric device and a lithium ion secondary battery using the negative electrode active material described above.

BACKGROUND

Various measures for reduction of emissions of carbon dioxide are being adopted in order to deal with atmospheric pollution and global warming. In the automobile industry, the reduction of emissions of carbon dioxide is highly expected in association with the spread of electric vehicles and hybrid electric vehicles. Thus, development of high-performance secondary batteries used as power sources for driving motors for use in these vehicles is being carried out.

In particular, a higher capacity and cycle property are required for the secondary batteries used for driving the motors. In view of this, lithium ion secondary batteries having high theoretical energy are gaining increasing attention among other types of secondary batteries.

The lithium ion secondary batteries are required to store a large amount of electricity in positive electrodes and negative electrodes per unit mass in order to increase energy density in the lithium ion secondary batteries. Thus, it is quite important for the lithium ion secondary batteries to determine appropriate active materials used in the respective electrodes so as to fulfill such a requirement.

Japanese Unexamined Patent Application Publication No. 2004-311429 has proposed an electrode material and an electrode structure capable of improving performance of a lithium ion secondary battery with low resistivity, high charge-discharge efficiency and high capacity, and has further proposed a secondary battery using these electrode material and electrode structure. In particular, the electrode material disclosed in Japanese Unexamined Patent Application Publication No. 2004-311429 includes solid-state alloy particles mainly containing silicon, in which a microcrystalline or amorphous substance containing an element other than silicon is dispersed in microcrystalline silicon or amorphous silicon.

However, the lithium ion secondary battery using the electrode material described in Japanese Unexamined Patent Application Publication No. 2004-311429 has a problem of decreasing cycle life of the electrode because of a shift from an amorphous state to a crystalline state caused when silicon is alloyed with lithium and thereby resulting in a great change in volume. In addition, in the case that the Si series active material is used, a capacity generally has a trade-off relationship with cycle durability. Thus, there has been a demand for development of active materials capable of concurrently ensuring a high capacity and high cycle durability.

BRIEF SUMMARY

The present invention has been made in view of the conventional problem. An object of the present invention is to provide a negative electrode active material for an electric device capable of suppressing amorphous-crystal phase transition so as to extend cycle life and ensure a high capacity. Another object of the present invention is to provide a negative electrode, an electric device and a lithium ion secondary battery using such a negative electrode active material.

A negative electrode active material for an electric device according to an aspect of the present invention includes an alloy containing, in terms of mass ratio, $35\% \leq Si \leq 78\%$, $7\% \leq Sn \leq 30\%$, $0\% < Ti \leq 37\%$ and/or $35\% \leq Si \leq 52\%$, $30\% \leq Sn \leq 51\%$, $0\% < Ti \leq 35\%$, and inevitable impurities as a residue.

DESCRIPTION OF EMBODIMENTS

Figure 1:
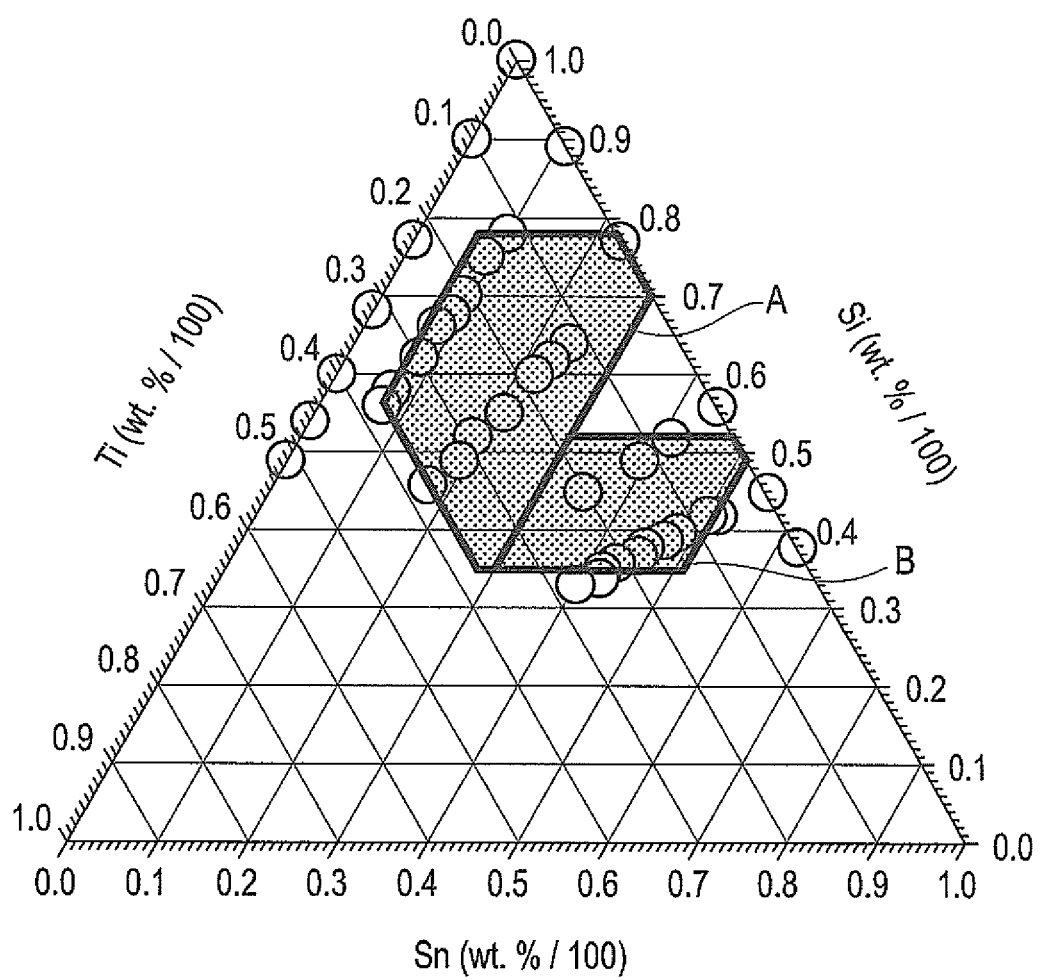
FIG. 1 is a ternary composition diagram showing composition ranges of a Si—Sn—Ti series alloy contained in a negative electrode active material for an electric device according to an embodiment of the present invention, wherein an alloy composition obtained for each example is plotted.
Figure 2:
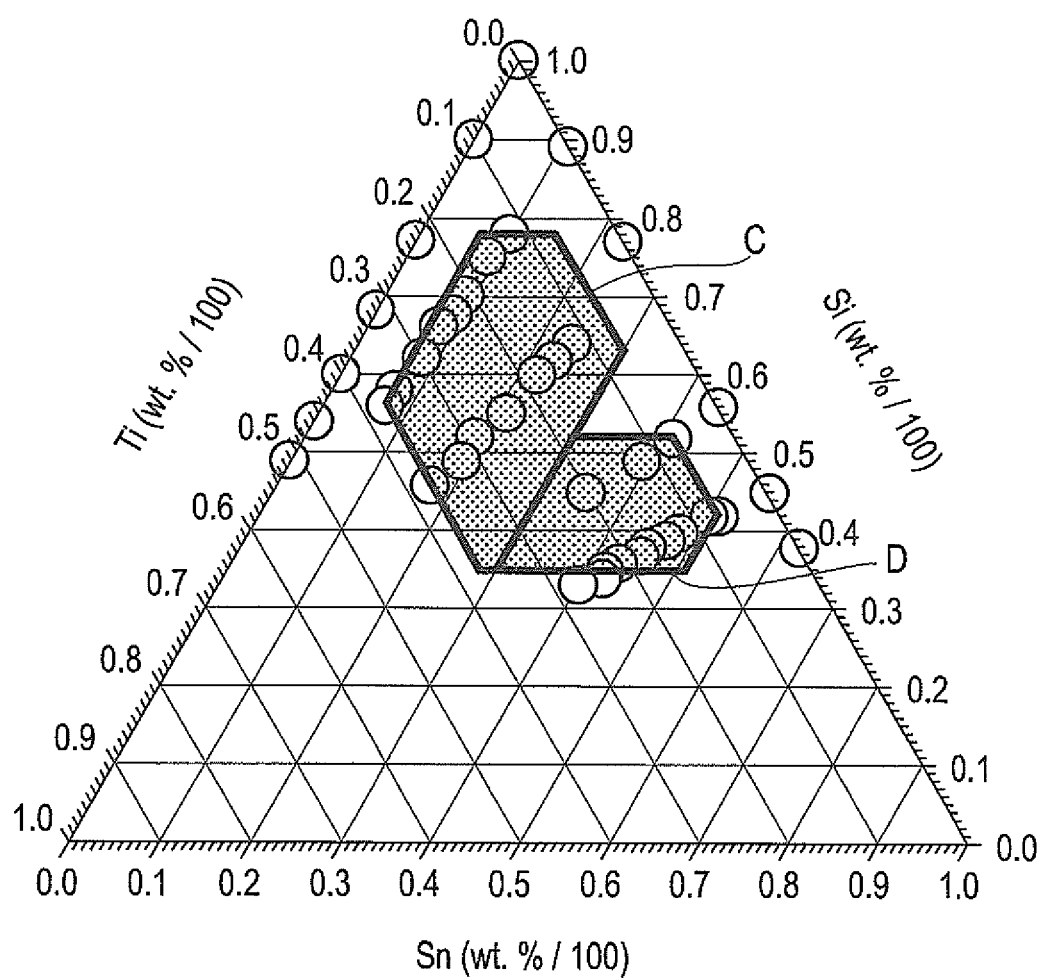
FIG. 2 is a ternary composition diagram showing preferred composition ranges of the Si—Sn—Ti series alloy contained in the negative electrode active material according to the present embodiment.

Hereinafter, a negative electrode active material for an electric device according to the present embodiment, a negative electrode for an electric device and an electric device using the negative electrode active material will be explained in detail. Here, for reasons of expediency, a lithium ion secondary battery will be exemplified as an electric device to which the negative electrode active material can be applied to explain the negative electrode active material for an electric device, the negative electrode for an electric device, and the electric device. It should be noted that dimensional ratios in the drawings are magnified for convenience of explanation and may be different from actual ratios.

The negative electrode active material for an electric device according to the present embodiment includes an alloy containing elements, which fall within a first region indicated by reference sign A or within a second region indicated by reference sign B in FIG. 1, and inevitable impurities as a residue. The first region includes silicon (Si) in the range from 35% by mass to 78% by mass inclusive, tin (Sn) in the range from 7% by mass to 30% by mass inclusive, and titanium (Ti) of greater than 0% by mass and 37% by mass or less. The second region includes Si in the range from 35% by mass to 52% by mass inclusive, Sn in the range from 30% by mass to 51% by mass inclusive, and Ti of greater than 0% by mass and 35% by mass or less. Note that "wt %/100" shown in FIG. 1 to FIG. 4 indicates that the value (% by mass) of each element is divided by 100.

The negative electrode active material according to the present embodiment includes, with respect to silicon (Si), tin (Sn) selected as a first additive element and titanium (Ti) selected as a second additive element. The addition of these elements can suppress amorphous-crystal phase transition when the negative electrode active material is alloyed with lithium (Li) so as to extend cycle life. This negative electrode active material contributes to ensuring a higher capacity compared with conventional negative electrode active materials, for example, carbon series negative electrode active materials. The composition ranges of Sn and Ti as the first and second additive elements are optimally determined so as to obtain the negative electrode active material containing the Si series alloy capable of exhibiting better cycle life after 50 cycles and even after 100 cycles.

In particular, when the negative electrode active material described above is used in a negative electrode for a lithium ion secondary battery, the alloy described above absorbs lithium ions when the battery is charged and releases the lithium ions when the battery is discharged. The negative electrode active material contains tin (Sn) as the first additive element and titanium (Ti) as the second additive element to suppress amorphous-crystal phase transition when the negative electrode active material is alloyed with lithium by the battery charge so as to extend the cycle life. Accordingly, the negative electrode active material containing the Si (Si—Sn—Ti series) alloy according to the present embodiment can ensure a high capacity and high cycle durability, and further achieve high charge-discharge efficiency in the initial stage.

The negative electrode active material according to the present embodiment is characterized by the inclusion of the Si—Sn—Ti series alloy within the composition ranges described above. If the contents of the elements of silicon, tin and titanium do not fall within the respective composition ranges described above, the initial discharge capacity cannot exceed 1000 mAh/g, and the discharge capacity retention after 50 cycles cannot exceed 90%, as explained in examples below.

In order to further improve the properties of the negative electrode active material, the content of titanium is preferably greater than or equal to 7% by mass. Namely, as indicated by reference sign C in FIG. 2, the first region preferably includes silicon (Si) in the range from 35% by mass to 78% by mass inclusive, tin (Sn) in the range from 7% by mass to 30% by mass inclusive, and titanium (Ti) in the range from 7% by mass to 37% by mass inclusive. In addition, as indicated by reference sign D in FIG. 2, the second region preferably includes Si in the range from 35% by mass to 52% by mass inclusive, Sn in the range from 30% by mass to 51% by mass inclusive, and Ti in the range from 7% by mass to 35% by mass inclusive. Accordingly, the discharge capacity retention of greater than or equal to 45% after 50 cycles can be ensured.

Figure 3:
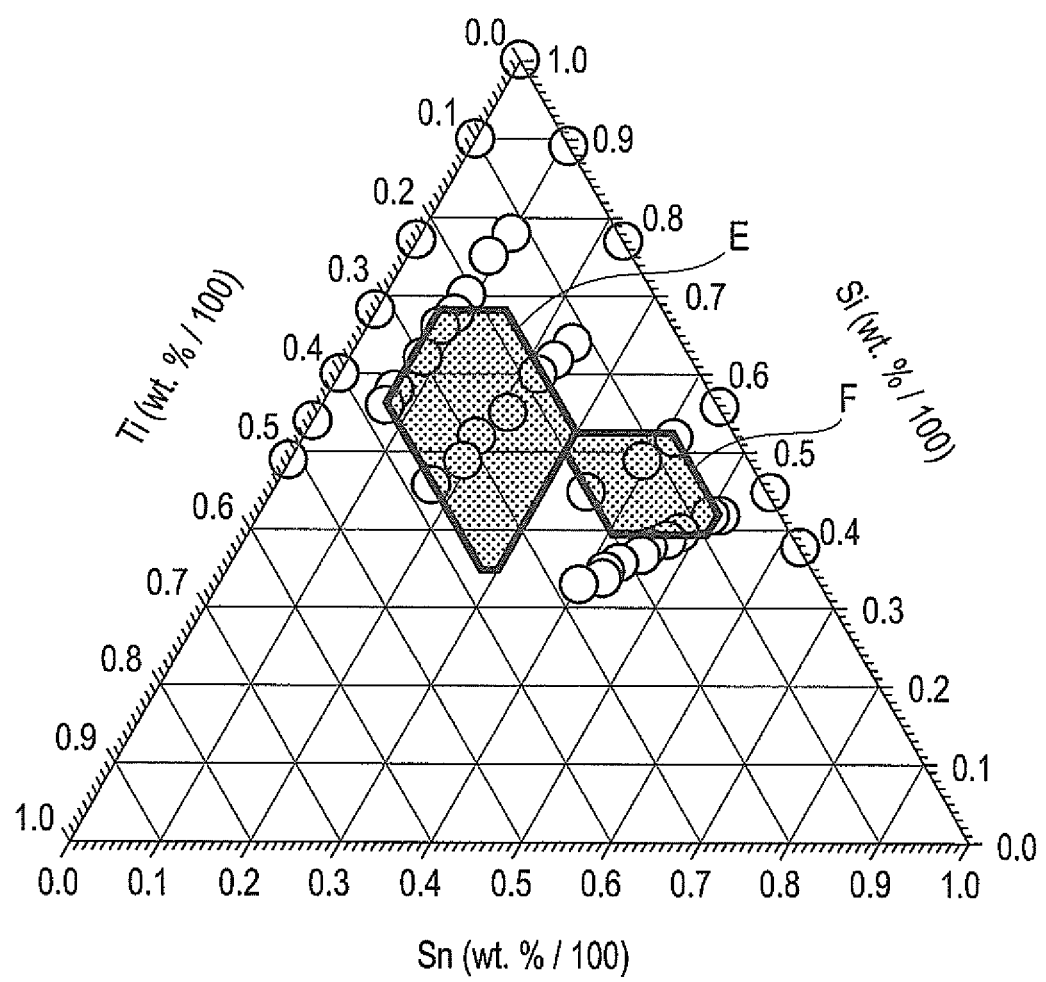
FIG. 3 is a ternary composition diagram showing further preferred composition ranges of the Si—Sn—Ti series alloy contained in the negative electrode active material according to the present embodiment.

In order to achieve a higher cycle property, as indicated by reference sign E in FIG. 3, the first region preferably includes Si in the range from 35% by mass to 68% by mass inclusive, Sn in the range from 7% by mass to 30% by mass inclusive, and Ti in the range from 18% by mass to 37% by mass inclusive. In addition, as indicated by reference sign F in FIG. 3, the second region preferably includes Si in the range from 39% by mass to 52% by mass inclusive, Sn in the range from 30% by mass to 51% by mass inclusive, and Ti in the range from 7% by mass to 20% by mass inclusive.

Figure 4:
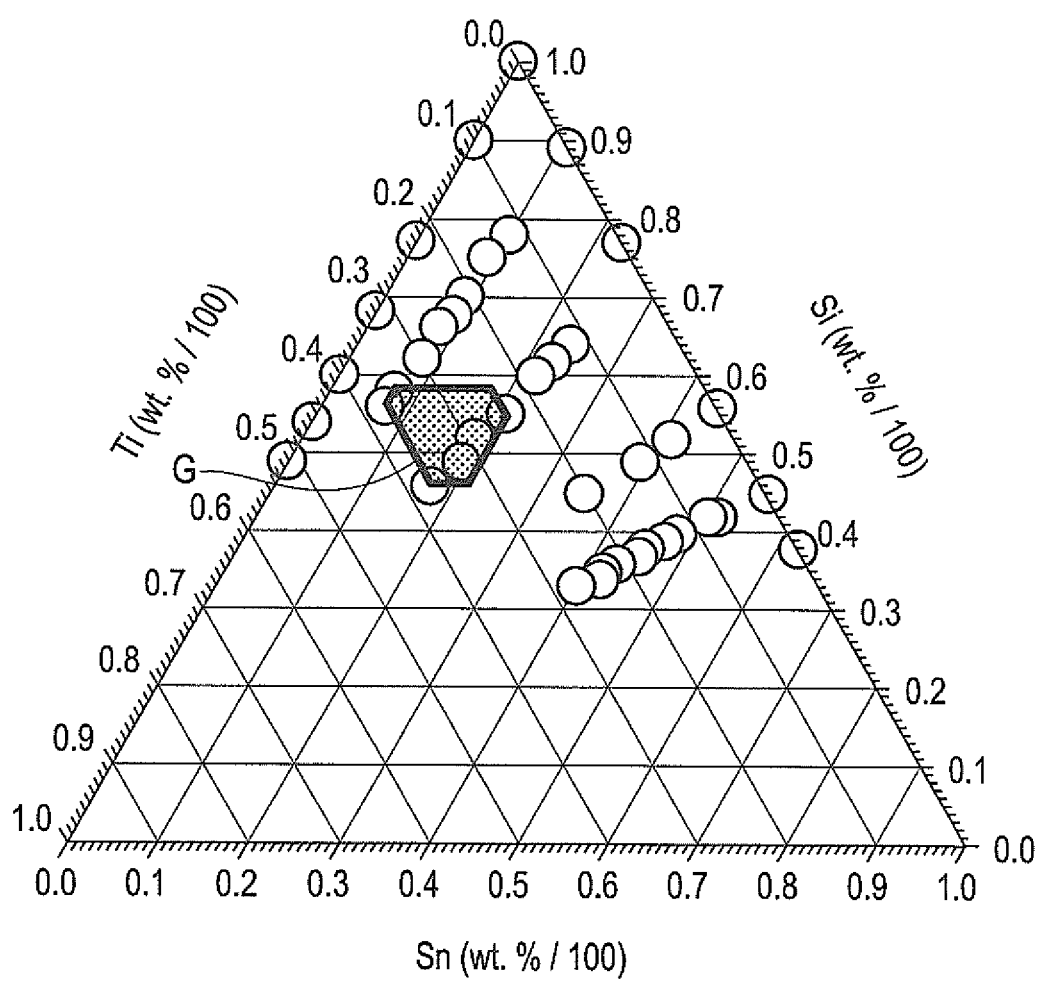
FIG. 4 is a ternary composition diagram showing still further preferred composition ranges of the Si—Sn—Ti series alloy contained in the negative electrode active material according to the present embodiment.

In view of the initial discharge capacity and the cycle property, the negative electrode active material according to the present embodiment particularly preferably contains the elements included in the region indicated by reference sign G in FIG. 4 and inevitable impurities as a residue. The region indicated by reference sign G includes Si in the range from 46% by mass to 58% by mass inclusive, Sn in the range from 7% by mass to 21% by mass inclusive, and Ti in the range from 24% by mass to 37% by mass inclusive.

Here, the negative electrode active material according to the present invention inevitably contains impurities derived from the raw materials and the production method, in addition to the three elements described above. The content of the inevitable impurities is preferably less than 0.5% by mass, more preferably less than 0.1% by mass.

As described above, the alloy included in the negative electrode active material according to the present embodiment contains, in terms of mass ratio, $35\% \leq Si \leq 78\%$, $7\% \leq Sn \leq 30\%$, $0\% < Ti \leq 37\%$ and/or $35\% \leq Si \leq 52\%$, $30\% \leq Sn \leq 51\%$, $0\% < Ti \leq 35\%$, and inevitable impurities as a residue. Namely, the alloy consists of, in terms of mass ratio, $35\% \leq Si \leq 78\%$, $7\% \leq Sn \leq 30\%$, $0\% < Ti \leq 37\%$ and/or $35\% \leq Si \leq 52\%$, $30\% \leq Sn \leq 51\%$, $0\% < Ti \leq 35\%$, and inevitable impurities.

Next, a method for manufacturing the negative electrode active material according to the present embodiment described above will be explained. The method for manufacturing the negative electrode active material according to the present embodiment, which is the Si—Sn—Ti series alloy having the above-described composition, is not particularly limited, and conventionally known various methods may be employed. Namely, any conventional manufacturing methods may be used without any particular obstacle, since there is little difference in the conditions and characteristics of the alloy depending on the manufacturing methods.

An example of the negative electrode active material according to the present embodiment may be a thin film alloy. The method for manufacturing such an alloy may be a multi physical vapor deposition method (a multi PVD method) such as a sputtering method, a resistance heating method and a laser ablation method, or a multi chemical vapor deposition method (a multi CVD method) such as a chemical vapor-phase growth method. These methods can manufacture a negative electrode in a manner such that an alloyed thin film is directly applied to a substrate serving as a current collector. The alloyed thin film thus has the advantage of simplification of the manufacturing process. In addition, the alloyed thin film need not use other components, such as a binder and an electric conducting additive, other than the negative electrode active material (the alloy). Therefore, the alloyed thin film as the negative electrode active material can simply be used for the negative electrode. Accordingly, the alloyed thin film contributes to ensuring a high capacity and high energy density, which satisfy the level suitable for practical use in vehicles. Furthermore, the thin film alloy is suitable for analysis of the electrochemical characteristics of the negative electrode active material.

The alloyed thin film may be manufactured by use of a multi DC magnetron sputtering apparatus, such as an independently controllable ternary DC magnetron sputtering apparatus. This apparatus may freely form Si—Sn—Ti series alloyed thin films having various alloy constitutions and thicknesses on the surface of the substrate (the current collector). In particular, various alloys may be obtained in such a manner as to use silicon (Si) as target 1, tin (Sn) as target 2 and titanium (Ti) as target 3, fix the sputtering time, and vary the power level of the DC power source for each target. Further, ternary series alloy samples having various constitutions can be obtained in such a manner as to, for example, change the DC power source to 185 W for Si, in the range from 0 W to 120 W for Sn, and in the range from 0 W to 150 W for Ti. It should be noted that, since sputtering conditions depend on sputtering devices, it is preferable to estimate appropriate ranges of the sputtering conditions through preliminary tests for each sputtering device.

As described above, the negative electrode active material layer according to the present embodiment can use the Si—Sn—Ti series alloyed thin film. Alternatively, the negative electrode active material layer may be a layer containing particles of the Si—Sn—Ti series alloy. That is, another example of the negative electrode active material according to the present embodiment may be an alloy in a particle state.

An example of a method for manufacturing the alloy in the particle state having the composition described above may be a mechanical alloying method. Alternatively, a roll rapid cooling method for solidification after arc plasma melting may also be used. When the alloy in the particle state is used as the negative electrode active material, slurry is prepared first in a manner such that a binder, an electric conducting additive and a viscosity control solvent are added to the alloy particles, and the slurry thus obtained is applied to the current collector so as to obtain the negative electrode. Such a process is superior to the method for manufacturing the alloyed thin film described above in terms of mass production and practicality for actual battery electrodes.

When the alloy in the particle state is used as the negative electrode active material, the average particle diameter of the particles is not particularly limited as long as it is substantially the same as that employed in conventional negative electrode active materials. Here, in view of higher output power, the average particle diameter (D50) of the alloy is preferably in the range from 1 μm to 20 μm. However, the average particle diameter does not necessarily fall within this range as long as it can effectively achieve the effects described above.

The negative electrode for an electric device according to the present embodiment includes the negative electrode active material containing the Si—Sn—Ti series alloy described above. A lithium ion secondary battery as a representative example of the electric device includes the negative electrode in which the negative electrode active material layer containing the negative electrode active material is formed on the surface of the current collector. Hereinafter, the configuration of the lithium ion secondary battery and the materials used therein will be explained in detail with reference to the drawing.

A lithium ion secondary battery generally has a configuration in which positive electrodes and negative electrodes are connected via electrolyte layers, each positive electrode having a configuration in which a positive electrode active material and the like is applied to a positive electrode current collector, each negative electrode having a configuration in which a negative electrode active material and the like is applied to a negative electrode current collector. The lithium ion secondary battery has a structure in which a laminated body including the positive electrodes, the electrolyte layers and the negative electrodes is housed in a battery case.

The positive electrode in the lithium ion secondary battery has a configuration in which a positive electrode active material layer is formed on one surface or both surfaces of a current collector (a positive electrode current collector). The current collector may contain an electrically conductive material such as aluminum foil, copper foil, nickel foil or stainless foil. The positive electrode active material layer contains an electric conducting additive and a binder as necessary together with the positive electrode active material.

The thickness of the current collector is not particularly limited but is generally preferably in the range from 1 μm to 30 μm. The content ratio of the positive electrode active material, the electric conducting additive and the binder in the positive electrode active material layer is not particularly limited.

The positive electrode active material contains one of or two or more kinds of positive electrode materials capable of absorbing and releasing lithium, and may contain a binder and an electric conducting additive as necessary.

The positive electrode material capable of absorbing and releasing lithium is preferably a lithium-containing compound in view of, for example, a high capacity and output performance. Examples of the lithium-containing compound include a composite oxide containing lithium and a transition metal element, a phosphate compound containing lithium and a transition metal element, a sulfated compound containing lithium and a transition metal element, a solid solution series material, a ternary series material, a NiMn series material, a NiCo series material, and a spinel manganese series material.

Examples of the composite oxide containing lithium and a transition metal element include $LiMn_2O_4$, $LiCoO_2$, $LiNiO_2$, $Li(NiMnCo)O_2$, $Li(LiNiMnCo)O_2$, $LiFePO_4$, and an oxide in which part of the transition metal contained in each of these composite oxides is replaced with other elements.

A specific example of the phosphate compound containing lithium and a transition metal element may be $LiFePO_4$ or $LiFeMnPO_4$. Alternatively, a compound in which part of the transition metal contained in these phosphate compounds is replaced with other elements, may also be used in order to stabilize the structure. A specific example of the sulfated compound containing lithium and a transition metal element may be $Li_xFe_2(SO_4)_3$.

Examples of the solid solution series material include $xLiMO_2 \cdot (1-x)Li_2NO_3$ (where $0<x<1$, M represents at least one transition metal in an average oxidation state of 3+, and N represents at least one transition metal in an average oxidation state of 4+), and $LiRO_2$—$LiMn_2O_4$ (where R represents a transition metal element such as Ni, Mn, Co and Fe).

The ternary series material may be a nickel-cobalt-manganese composite positive electrode material. The spinel manganese series material may be $LiMn_2O_4$. The NiMn series material may be $LiNi_{0.5}Mn_{1.5}O_4$. The NiCo series material may be $Li(NiCo)O_2$. Two or more kinds of the positive electrode active materials may be combined together according to circumstances. In view of a high capacity and output performance, the lithium-transition metal composite oxide is preferably used for the positive electrode active material.

The particle diameter of the positive electrode active material is not particularly limited. However, it is generally preferably as small as possible and, in view of operation efficiency and ease of handling, the average particle diameter of the positive electrode active material may be approximately in the range from 1 µm to 30 µm, preferably approximately in the range from 5 µm to 20 µm. Other positive electrode active materials having different particle diameters may be used. In the case that the active materials require different particle diameters in order to achieve their own appropriate effects, the active materials having different particle diameters may be selected and mixed together so as to optimally function to achieve their own effects. Thus, it is not necessary to equalize the particle diameter of all of the active materials.

The binder is added to bind the active materials to each other or bind the active material to the current collector to maintain the electrode structure. The binder may be thermoplastic resin such as polyvinylidene fluoride (PVDF), polytetrafluoroethylene (PTFE), polyvinyl acetate, polyimide (PI), polyamide (PA), polyvinyl chloride (PVC), polymethyl acrylate (PMA), polymethyl methacrylate (PMMA), polyether nitrile (PEN), polyethylene (PE), polypropylene (PP), and polyacrylonitrile (PAN); thermosetting resin such as epoxy resin, polyurethane resin, and urea resin; or a rubber material such as styrene-butadiene rubber (SBR).

The electric conducting additive is an additive added to improve electric conductivity. The electric conducting additive is not particularly limited, and a conventionally known agent may be used. For example, the electric conducting additive may be a carbon material such as carbon black (such as acetylene black), graphite, and carbon fiber. The addition of the electric conducting additive contributes to effectively establishing an electronic network in the active material layer so as to improve output performance and battery reliability in association with an improvement in retention of an electrolysis solution.

The negative electrode in the lithium ion secondary battery has a configuration, as in the case of the positive electrode, in which a negative electrode active material layer is formed on one surface or both surfaces of a current collector (a negative electrode current collector) containing the electrically conductive material described above. The negative electrode active material layer according to the present embodiment may be a thin film including the Si—Sn—Ti series alloy as described above. In that case, the negative electrode active material layer may consist of the Si—Sn—Ti series alloy or may further contain a different negative electrode active material described below.

Alternatively, as described above, the negative electrode active material layer may be a layer containing the particles of the Si—Sn—Ti series alloy as a main component. In that case, the negative electrode active material layer may contain the electric conducting additive and the binder as necessary. Note that, in the present description, "a main component" represents a component contained in the negative electrode active material layer with content of greater than or equal to 50% by mass.

The lithium ion secondary battery according to the present embodiment includes the negative electrode active material containing the Si—Sn—Ti series alloy having the above-described composition. Note that a conventionally known negative electrode active material capable of reversibly absorbing and releasing lithium may be used together without any particular obstacle as long as the negative electrode active material containing the above-described alloy is included as an essential component.

The other negative electrode active material may be a carbon material such as graphite which is highly crystalline carbon (such as natural graphite and artificial graphite), low crystalline carbon (such as soft carbon and hard carbon), carbon black (such as Ketjenblack (registered trademark), acetylene black, channel black, lamp black, oil furnace black, and thermal black), fullerene, carbon nanotube, carbon nanofiber, carbon nanohorn, and carbon fibril. Another example of the negative electrode active material may be a single substance alloyed with lithium such as Si, Ge, Sn, Pb, Al, In, Zn, H, Ca, Sr, Ba, Ru, Rh, Ir, Pd, Pt, Ag, Au, Cd, Hg, Ga, Tl, C, N, Sb, Bi, O, S, Se, Te, and Cl, or an oxide and a carbide containing these elements. The oxide may be silicon monoxide (SiO), $SiO_x$ ($0<x<2$), tin dioxide ($SnO_2$), $SnO_x$ ($0<x<2$), or $SnSiO_3$, and the carbide may be silicon carbide (SiC). Still another example of the negative electrode active material may be a metallic material such as lithium metal, or a lithium-transition metal composite oxide such as a lithium-titanium composite oxide (lithium titanate: $Li_4Ti_5O_{12}$). However, the negative electrode active material is not limited to these materials and may be conventionally known materials used for negative electrode active materials for lithium ion secondary batteries. These negative electrode active materials may be used singly, or two or more kinds thereof may be mixed together.

The electric conducting additive and the binder contained in the negative electrode active material may be the same as those contained in the positive electrode active material layer.

The negative electrode may be obtained in a manner such that slurry containing the negative electrode active material together with the electric conducting additive and the binder, is applied to the surface of the current collector to form the negative electrode active material layer. Alternatively, the negative electrode may be obtained in a manner such that, by a multi PVD method or a multi CVD method, a thin film of the negative electrode active material alloy is directly formed on the surface of the current collector to form the negative electrode active material layer.

As described above, the positive electrode active material layer and the negative electrode active material layer are each provided on one surface or both surfaces of the respective current collectors. Alternatively, one current collector may be provided with the positive electrode active material layer on one surface thereof and provided with the negative electrode active material layer on the other surface thereof. Electrodes having such a configuration are used for a bipolar battery.

The electrolyte layer contains a non-aqueous electrolyte. The non-aqueous electrolyte contained in the electrolyte layer serves as a carrier of lithium ions that move between the positive electrode and the negative electrode during charge and discharge. The thickness of the electrolyte layer is preferably reduced as much as possible so as to decrease internal resistance. The thickness is generally approximately in the range from 1 µm to 100 µm, preferably in the range from 5 µm to 50 µm.

The non-aqueous electrolyte is not particularly limited as long as it has the function described above, and may be a liquid electrolyte or a polymer electrolyte.

The liquid electrolyte (the electrolysis solution) has a constitution in which lithium salt (electrolyte salt) is dissolved in an organic solvent. The organic solvent may be carbonate such as ethylene carbonate (EC), propylene carbonate (PC), butylene carbonate (BC), vinylene carbonate (VC), dimethyl carbonate (DMC), diethyl carbonate (DEC), ethyl methyl carbonate (EMC), and methyl propyl carbonate (MPC). The lithium salt may be a compound that can be added to the electrode active material layers of the electrodes, such as $Li(CF_3SO_2)_2N$, $Li(C_2F_5SO_2)_2N$, $LiPF_6$, $LiBF_4$, $LiAsF_6$, $LiTaF_6$, $LiClO_4$, and $LiCF_3SO_3$.

The polymer electrolyte is divided into two types; a gel polymer electrolyte (a gel electrolyte) containing an electrolysis solution, and an intrinsic polymer electrolyte not containing an electrolysis solution.

The gel polymer electrolyte preferably has a constitution in which the liquid electrolyte is poured into a matrix polymer (a host polymer) including an ion conductive polymer. The use of the gel polymer electrolyte in the electrolyte layer has the advantage of decreasing fluidity of the electrolyte so as to easily interrupt ion conduction between the respective layers.

The ion conductive polymer used for the matrix polymer (the host polymer) is not particularly limited. Examples thereof include polyethylene oxide (PEO), polypropylene oxide (PPO), polyvinylidene fluoride (PVDF), a copolymer of polyvinylidene fluoride and hexafluoropropylene (PVDF-HFP), polyethylene glycol (PEG), polyacrylonitrile (PAN), polymethyl methacrylate (PMMA), and a copolymer of these compounds. The ion conductive polymer may be the same as, or different from, an ion conductive polymer used as the electrolyte in the active material layers, but is preferably the same. The type of the electrolysis solution (the lithium salt and the organic solvent) is not particularly limited and may employ the electrolyte salt such as the lithium salt exemplified above and the organic solvent such as the carbonate exemplified above.

The intrinsic polymer electrolyte has a constitution in which lithium salt is dissolved in the matrix polymer, but no organic solvent is contained. Thus, the use of the intrinsic polymer electrolyte contributes to reducing the risk of liquid leakage from the battery and thereby increasing reliability of the battery.

The matrix polymer of the gel polymer electrolyte or the intrinsic polymer electrolyte can exhibit high mechanical strength when a cross-linked structure is formed. The cross-linked structure may be formed in a manner such that a polymerizable polymer used for polymer electrolyte formation (for example, PEO and PPO) is subjected to polymerization, such as thermal polymerization, ultraviolet polymerization, radiation polymerization, and electron beam polymerization, by use of an appropriate polymerization initiator.

The non-aqueous electrolyte contained in the electrolyte layer may be used singly, or two or more kinds thereof may be mixed together.

Here, a separator is used in the electrolyte layer when the electrolyte layer contains the liquid electrolyte or the gel polymer electrolyte. The specific configuration of the separator may be a microporous film containing polyolefin such as polyethylene and polypropylene.

The lithium ion secondary battery includes a battery element (an electrode structure) including the above-described positive electrodes and negative electrodes connected to each other via the electrolyte layers. The lithium ion secondary battery has a structure in which the battery element is housed in a battery case such as a can body or a laminate container (a package body). The battery element is divided into two types: a wound type battery having a structure in which positive electrodes, electrolyte layers and negative electrodes are wound, and a laminated type battery having a structure in which positive electrodes, electrolyte layers and negative electrodes are stacked. The bipolar battery described above has a laminated type structure. The battery is also referred to as a coin cell, a button battery or a laminated battery depending on the shape and structure of the battery case.

Figure 8:
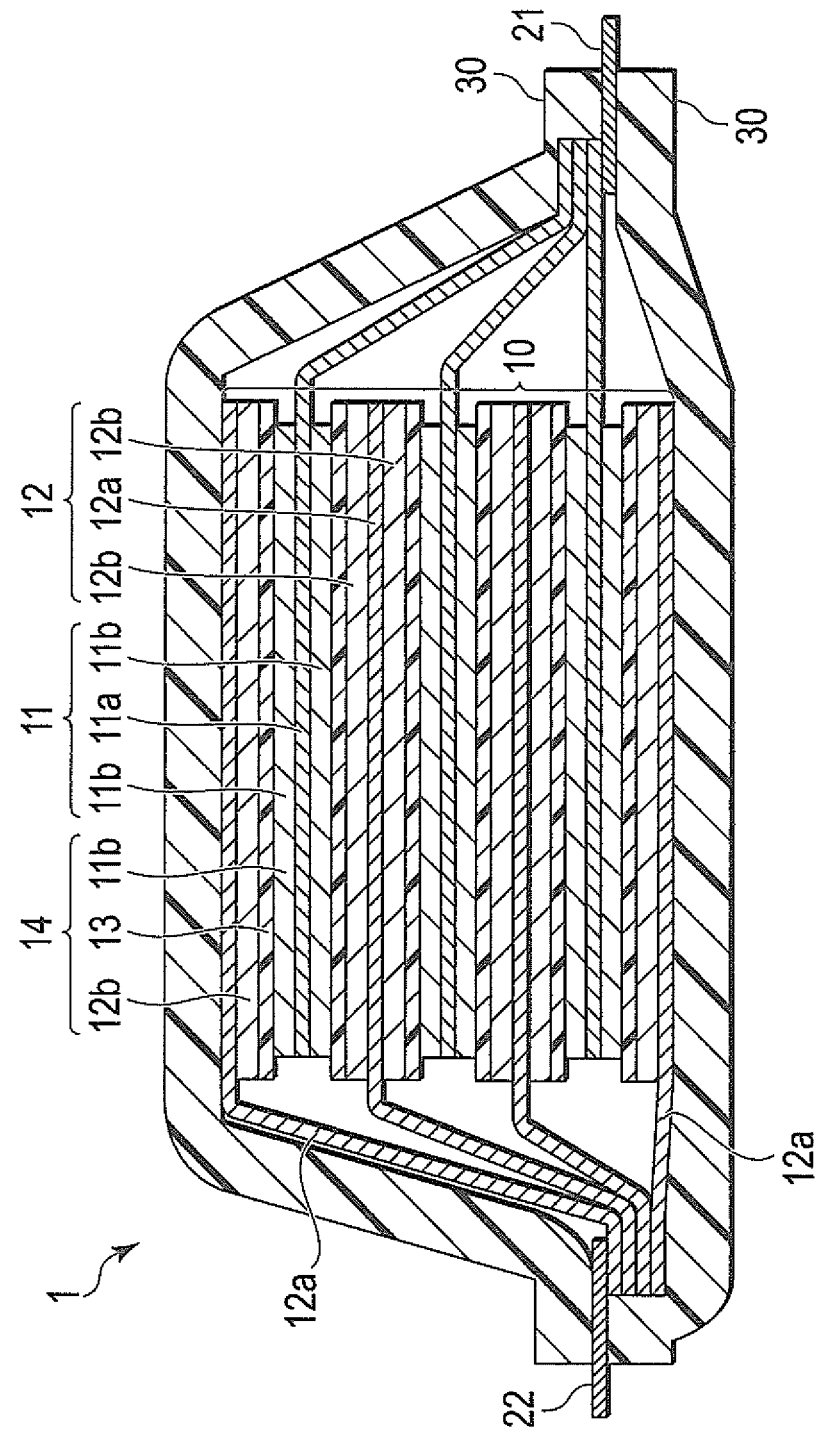
FIG. 8 is a schematic cross-sectional view showing an example of a lithium ion secondary battery according to an embodiment of the present invention.

FIG. 8 is a schematic cross-sectional view showing an example of the lithium ion secondary battery according to the embodiment of the present invention. As shown in FIG. 8, the lithium ion secondary battery 1 according to the present embodiment has a configuration in which a battery element 10 to which a positive electrode tab 21 and a negative electrode tab 22 are attached, is sealed in a laminated body 30. In the present embodiment, the positive electrode tab 21 and the negative electrode tab 22 are exposed to the outside of the laminated body 30 on opposite sides. Although not shown in the figure, the positive electrode tab and the negative electrode tab may be exposed to the outside of the laminated body on the same side. In addition, the positive electrode tab and the negative electrode tab may be attached to positive electrode current collectors and negative electrode current collectors described below by, for example, ultrasonic welding or resistance welding.

The battery element 10 has a configuration in which several sets of a positive electrode 11 and a negative electrode 12 connected via an electrolyte layer 13 are stacked on top of each other, the positive electrode 11 having a configuration in which positive electrode active material layers 11b are formed on both main surfaces of a positive electrode current collector 11a, the negative electrode 12 having a configuration in which negative electrode active material layers 12b are formed on both main surfaces of a negative electrode current collector 12a.

In this case, the positive electrode active material layer 11b formed on one main surface of the positive electrode current collector 11a of one positive electrode 11, faces the negative electrode active material layer 12b formed on one main surface of the negative electrode current collector 12a of the negative electrode 12 adjacent to the one positive electrode 11 with the electrolyte layer 13 interposed therebetween. Several sets of the positive electrode, the electrolyte layer and the negative electrode arranged in this order are stacked on top of each other. The positive electrode active material layer 11b, the electrolyte layer 13 and the negative electrode active material layer 12b adjacent to each other constitute a single cell layer 14. Namely, the lithium ion secondary battery 1 according to the present embodiment has a configuration in which the plural single cell layers 14 are stacked on top of each other so as to be electrically connected in parallel. Here, the negative electrode current collectors 12a located on the outermost layers of the battery element 10 are each provided with the negative electrode active material layer 12b only on one side thereof.

EXAMPLES

Hereinafter, the present invention is explained in more detail with reference to Examples and Comparative Examples; however, the present invention is not limited to these examples.

Preparation of Negative Electrode

As a sputtering apparatus, an independently controllable ternary DC magnetron sputtering apparatus (manufactured by Yamato-Kiki Industrial Co., Ltd.; combinatorial sputter coating apparatus; gun-sample distance: about 100 mm) was used. Thin films of negative electrode active material alloys having various constitutions were each formed with this apparatus on a substrate (a current collector) made of nickel foil having a thickness of 20 μm, so as to obtain 40 negative electrode samples.

(1) Targets (manufactured by Kojundo Chemical Laboratory Co., Ltd.; purity: 4N)
Si target: diameter of 50.8 mm; thickness of 3 mm (with backing plate of oxygen-free copper with thickness of 2 mm)
Sn target: diameter of 50.8 mm; thickness of 5 mm
Ti target: diameter of 50.8 mm; thickness of 5 mm (2) Film Formation Conditions
Base pressure: up to $7 \times 10^{-6}$
Sputtering gas: Ar (99.9999% or higher)
Sputtering gas introduction amount: 10 sccm
Sputtering pressure: 30 mTorr
DC power source: Si (185 W), Sn (0 to 40 W), Ti (0 to 150 W)
Pre-sputtering time: 1 min.
Sputtering time: 10 min.
Substrate temperature: room temperature (25° C.)

Namely, in each example, the Si target, the Sn target and the Ti target were used, the sputtering time was set to 10 minutes, and the power level of the DC power source was changed in each target so as to be set to the respective ranges described above. Then, the alloyed thin films in an amorphous state were each formed on the Ni substrate so as to obtain the negative electrode samples including the alloyed thin films having various constitutions.

As for the sample preparation, for example, in Example 17, the DC power source 1 (the Si target) was set to 185 W, the DC power source 2 (the Sn target) was set to 30 W, and the DC power source 3 (the Ti target) was set to 150 W. In Comparative Example 2, the DC power source 1 (the Si target) was set to 185 W, the DC power source 2 (the Sn target) was set to 22 W, and the DC power source 3 (the Ti target) was set to 0 W. In Comparative Example 7, the DC power source 1 (the Si target) was set to 185 W, the DC power source 2 (the Sn target) was set to 0 W, and the DC power source 3 (the Ti target) was set to 30 W.

Tables 1, 2 and FIG. 1 show the constituent composition of the respective alloyed thin films. The obtained alloyed thin films were analyzed by use of the following analyzing method and analyzing device.

(3) Analyzing Method
Composition analysis: SEM-EDX analysis (manufactured by JEOL Ltd.), EPMA analysis (manufactured by JEOL Ltd.)
Film thickness measurement (for calculating sputtering rate): film thickness meter (manufactured by Tokyo Instruments, Inc.)
Film state analysis: Raman spectroscopic analysis (manufactured by Bruker Corporation)
Preparation of Batteries Each negative electrode sample obtained as described above was placed to face the counter electrode made of lithium foil with a separator interposed therebetween, and an electrolysis solution was poured therein, so as to prepare a CR2032 type coin cell for each example. The lithium foil used was lithium (manufactured by Honjo Metal Co., Ltd.) cut out in such a manner as to have a diameter of 15 mm and a thickness of 200 μm. The separator used was Celgard 2400 (manufactured by Celgard, LLC.). The electrolysis solution was prepared in a manner such that $LiPF_6$ (lithium hexafluorophosphate) was dissolved, at a concentration of 1 M, into a mixed non-aqueous solvent in which ethylene carbonate (EC) and diethyl carbonate (DEC) were mixed in the volume ratio of 1:1.

Charge-Discharge Test of Batteries

The batteries obtained as described above were each subjected to the following charge-discharge test in a manner such that a charge-discharge tester was used, and the respective batteries were charged and discharged in a thermostat bath set at 300 K (27° C.). In particular, each battery was charged at 0.1 mA from 2 V to 10 mV in constant current/constant voltage mode during charge (in the process of Li intercalation to the negative electrode to be subjected to evaluation). After that, each battery was discharged at 0.1 mA from 10 mV to 2 V in constant current mode during discharge (in the process of Li release from the negative electrode). This charge-discharge procedure was regarded as a single cycle and repeated 100 times. Here, the charge-discharge tester used was HJ0501SM8A (manufactured by Hokuto Denko Corporation), and the thermostat bath used was PFU-3K (manufactured by ESPEC Corp.).

Figure 5:
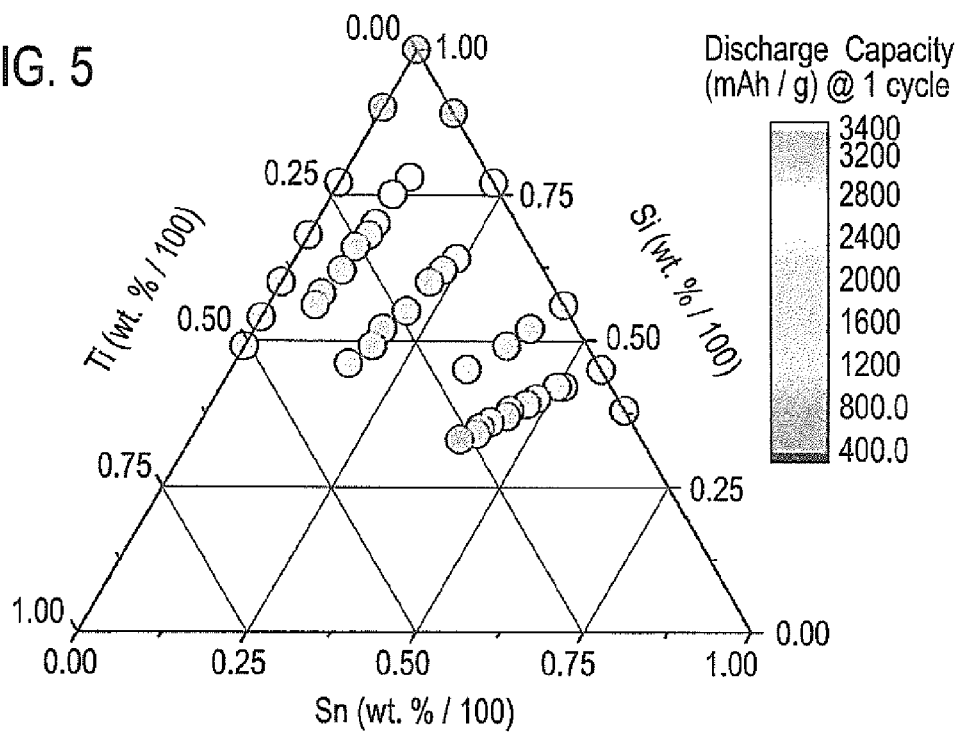
FIG. 5 is a diagram showing a relationship between an initial discharge capacity and the alloy composition of the negative electrode active material in a battery prepared in each of Examples and Comparative Examples.
Figure 6:
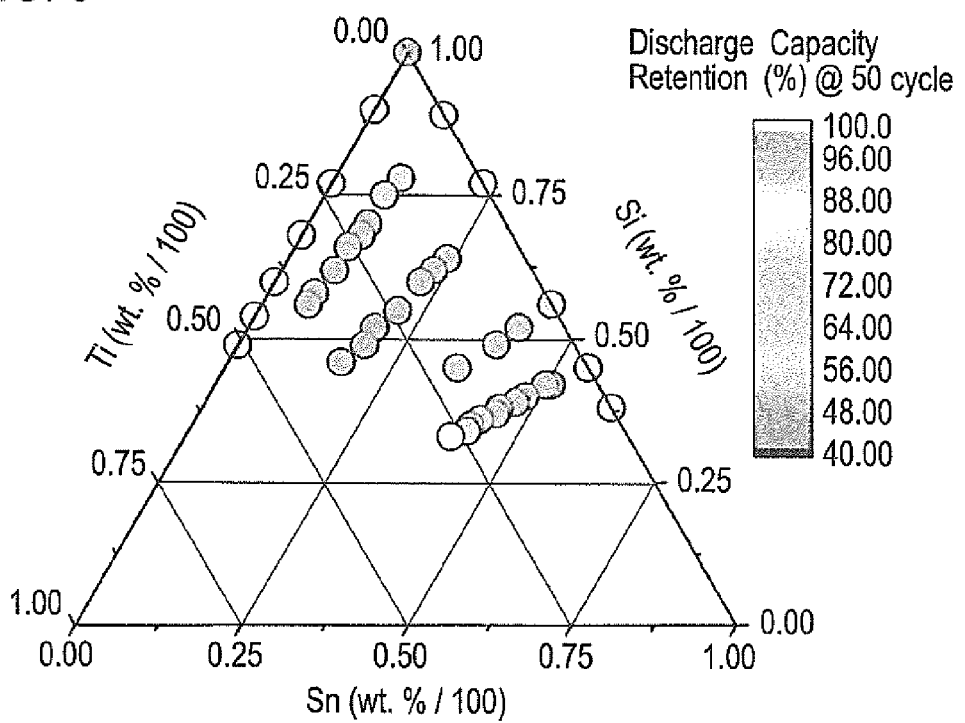
FIG. 6 is a diagram showing a relationship between a discharge capacity retention at the 50th cycle and the alloy composition of the negative electrode active material in the battery prepared in each of Examples and Comparative Examples.
Figure 7:
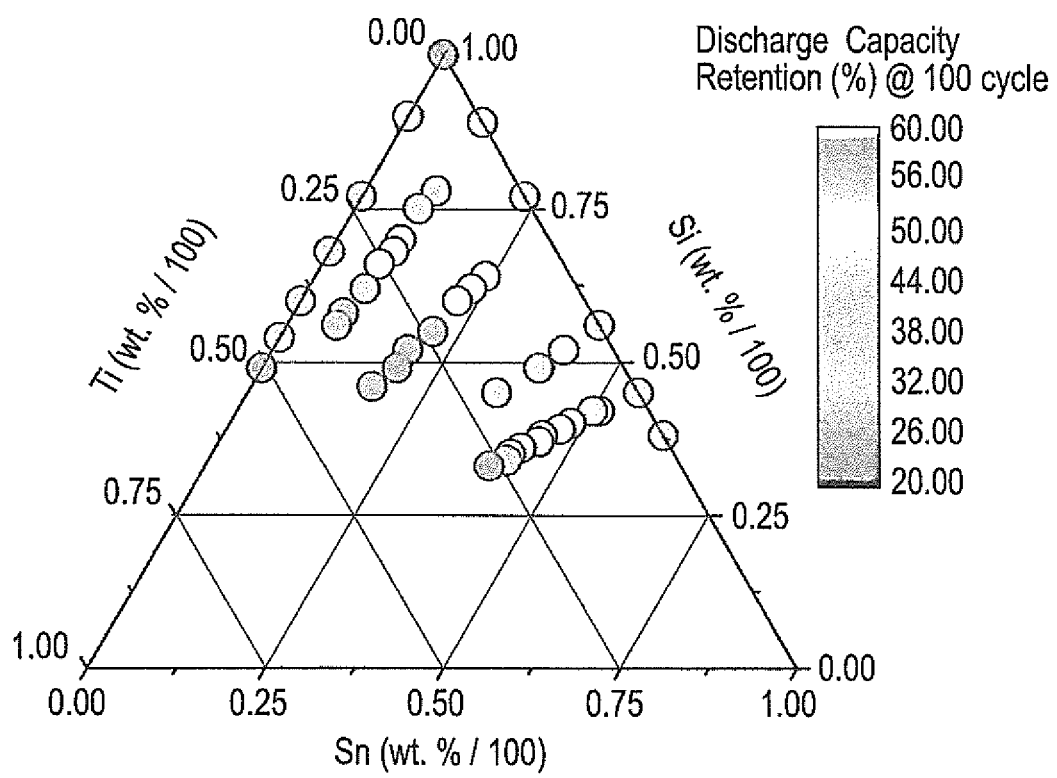
FIG. 7 is a diagram showing a relationship between a discharge capacity discharge capacity retention at the 100th cycle and the alloy composition of the negative electrode active material in the battery prepared in each of Examples and Comparative Examples.

Thereafter, a discharge capacity at the 50th cycle was obtained, and the value thus obtained was divided by the discharge capacity at the 1st cycle, so as to calculate a discharge capacity retention at the 50th cycle for each example. The discharge capacity retention at the 100th cycle was also calculated in the same manner. Tables 1 and 2 each show the discharge capacity at the 1st cycle and the obtained results of the respective discharge capacity retentions for each example. FIG. 5 shows a relationship between the discharge capacity at the 1st cycle and the alloy composition for each example. FIG. 6 and FIG. 7 each show a relationship between the discharge capacity retentions at the 50th cycle and at the 100th cycle and the alloy composition for each example. Here, the respective discharge capacities are indicated by values calculated per alloy weight.

TABLE 1

| | Negative Electrode Active Material Components (mass %) | | | Discharge Capacity at 1st Cycle (mAh/g) | Discharge Capacity Retention (%) | |
|---|---|---|---|---|---|---|
| | Si | Sn | Ti | | at 50th Cycle | at 100th Cycle |
| Example 1 | 52 | 41 | 7 | 1764 | 94 | 51 |
| Example 2 | 49 | 39 | 12 | 1635 | 95 | 53 |
| Example 3 | 45 | 35 | 20 | 1375 | 94 | 53 |
| Example 4 | 42 | 51 | 7 | 1319 | 98 | 52 |
| Example 5 | 42 | 50 | 8 | 1307 | 94 | 52 |
| Example 6 | 40 | 48 | 12 | 1217 | 94 | 51 |
| Example 7 | 39 | 47 | 14 | 1175 | 94 | 51 |
| Example 8 | 38 | 45 | 17 | 1108 | 94 | 49 |
| Example 9 | 37 | 45 | 18 | 1089 | 94 | 48 |
| Example 10 | 36 | 43 | 21 | 1050 | 93 | 47 |
| Example 11 | 35 | 42 | 23 | 1008 | 93 | 47 |
| Example 12 | 64 | 24 | 12 | 2277 | 93 | 46 |
| Example 13 | 62 | 23 | 15 | 2173 | 94 | 47 |
| Example 14 | 60 | 22 | 18 | 1978 | 94 | 50 |
| Example 15 | 55 | 21 | 24 | 1818 | 97 | 55 |
| Example 16 | 52 | 19 | 29 | 1661 | 98 | 58 |
| Example 17 | 49 | 19 | 32 | 1538 | 98 | 59 |
| Example 18 | 46 | 17 | 37 | 1371 | 96 | 58 |
| Example 19 | 78 | 10 | 12 | 2669 | 91 | 43 |
| Example 20 | 75 | 9 | 16 | 2531 | 91 | 43 |
| Example 21 | 70 | 9 | 21 | 2294 | 94 | 49 |
| Example 22 | 68 | 9 | 23 | 2194 | 94 | 50 |
| Example 23 | 66 | 8 | 26 | 2073 | 95 | 51 |
| Example 24 | 62 | 8 | 30 | 1878 | 95 | 53 |
| Example 25 | 58 | 7 | 35 | 1775 | 95 | 56 |
| Example 26 | 56 | 7 | 37 | 1632 | 96 | 55 |

TABLE 2

| | Negative Electrode Active Material Components (mass %) | | | Discharge Capacity at 1st Cycle (mAh/g) | Discharge Capacity Retention (%) | |
|---|---|---|---|---|---|---|
| | Si | Sn | Ti | | at 50th Cycle | at 100th Cycle |
| Comparative Example 1 | 100 | 0 | 0 | 3232 | 47 | 22 |
| Comparative Example 2 | 89 | 11 | 0 | 3149 | 78 | 36 |
| Comparative Example 3 | 77 | 23 | 0 | 2622 | 84 | 38 |

TABLE 2-continued

| | Negative Electrode Active Material Components (mass %) | | | Discharge Capacity at 1st Cycle (mAh/g) | Discharge Capacity Retention (%) | |
|---|---|---|---|---|---|---|
| | Si | Sn | Ti | | at 50th Cycle | at 100th Cycle |
| Comparative Example 4 | 56 | 44 | 0 | 1817 | 91 | 42 |
| Comparative Example 5 | 45 | 55 | 0 | 1492 | 91 | 42 |
| Comparative Example 6 | 38 | 62 | 0 | 1325 | 91 | 42 |
| Comparative Example 7 | 90 | 0 | 10 | 3218 | 82 | 36 |
| Comparative Example 8 | 77 | 0 | 23 | 2685 | 82 | 39 |
| Comparative Example 9 | 68 | 0 | 32 | 2398 | 82 | 39 |
| Comparative Example 10 | 60 | 0 | 40 | 2041 | 83 | 37 |
| Comparative Example 11 | 54 | 0 | 46 | 1784 | 83 | 32 |
| Comparative Example 12 | 49 | 0 | 51 | 1703 | 75 | 24 |
| Comparative Example 13 | 34 | 42 | 24 | 977 | 90 | 38 |
| Comparative Example 14 | 33 | 40 | 27 | 870 | 82 | 23 |

The test results revealed that the respective batteries of Examples including the negative electrode active materials containing the Si—Sn—Ti series alloys within the particular ranges, show the initial capacity exceeding at least 1000 mAh/g. Further, it was revealed that the respective batteries of Examples show the discharge capacity retention of greater than or equal to 91% after 50 cycles and show the discharge capacity retention of greater than or equal to 43% even after 100 cycles.

Although the present invention has been described above by reference to the examples, the present invention is not limited to the descriptions thereof, and it will be apparent to those skilled in the art that various modifications and improvements can be made.

The negative electrode active material for an electric device according to the present invention includes the Si—Sn—Ti series ternary alloy having the composition described above. Accordingly, the electric device such as a lithium ion secondary battery employing this negative electrode active material can improve the cycle life of the battery and ensure a high capacity and high cycle durability.

The invention claimed is:

1. A negative electrode active material for an electric device, comprising an alloy consisting of, in terms of mass ratio, 35%≤Si≤70% [35%≤Si≤68%], 7%≤Sn≤30%, 7%≤Ti≤37% or 35%≤Si≤52%, 30%≤Sn≤51%, 7%≤Ti≤35%, and inevitable impurities as a residue, wherein a composition of the alloy produces an initial discharge capacity greater than 1000 mAh/g and a discharge capacity retention after 50 cycles of 93% or greater.

2. The negative electrode active material for an electric device according to claim 1, wherein the alloy consists of, in terms of mass ratio, 35%≤Si≤68%, 7%≤Sn≤30%, 18%≤Ti≤37% or 39%≤Si≤52%, 30%≤Sn≤51%, 7%≤Ti≤20%, and inevitable impurities as a residue.

3. The negative electrode active material for an electric device according to claim 1, wherein the alloy consists of, in terms of mass ratio, 46%≤Si≤58%, 7%≤Sn≤21%, 24%≤Ti≤37%, and inevitable impurities as a residue.

4. A negative electrode for an electric device, comprising the negative electrode active material according to claim 1.

5. An electric device comprising the negative electrode for an electric device according to claim 4.

6. The electric device according to claim 5 that is a lithium ion secondary battery.

7. A negative electrode active material for an electric device, comprising an alloy containing, in terms of mass ratio, 35%≤Si≤68%, 7%≤Sn≤30%, 18%≤Ti≤37%, or 35%≤Si≤52%, 30%≤Sn≤51%, 7%≤Ti≤35%, and inevitable impurities as a residue, wherein a composition of the alloy produces an initial discharge capacity greater than 1000 mAh/g and a discharge capacity retention after 50 cycles of 93% or greater.

8. The negative electrode active material for an electric device according to claim 7, wherein the alloy contains, in terms of mass ratio, 46%≤Si≤58%, 7%≤Sn≤21%, 24%≤Ti≤37%, and inevitable impurities as a residue.

* * * * *